United States Patent
Kung et al.

(10) Patent No.: US 6,707,499 B1
(45) Date of Patent: Mar. 16, 2004

(54) TECHNIQUE TO INCREASE DYNAMIC RANGE OF A CCD IMAGE SENSOR

(75) Inventors: Chen-Pan Kung, Chung Li (TW); Tzu-Ping Lin, Pingtung (TW); Chih-Shih Yu, Hsinchu (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 0 days.

(21) Appl. No.: 09/206,952

(22) Filed: Dec. 8, 1998

(51) Int. Cl.[7] .......................... H04N 5/335; H04N 3/14; H01L 27/148; H01L 27/00
(52) U.S. Cl. ...................... 348/312; 348/322; 348/297; 348/319; 257/230; 250/208.1
(58) Field of Search .............................. 348/216.1, 294, 348/296, 299, 314, 316, 311, 312, 303, 319, 322; 257/223, 230, 443; 250/208.1

(56) References Cited

U.S. PATENT DOCUMENTS

| | | | | |
|---|---|---|---|---|
| 4,638,361 A | * | 1/1987 | Takeshita | 348/319 |
| 4,758,741 A | * | 7/1988 | Arques | 348/314 |
| 5,258,845 A | * | 11/1993 | Kyuma et al. | 348/299 |
| 5,324,669 A | * | 6/1994 | Kuroda et al. | 438/75 |
| 5,438,365 A | * | 8/1995 | Yamashita et al. | 348/312 |
| 5,572,256 A | * | 11/1996 | Egawa et al. | 348/296 |
| 5,606,366 A | * | 2/1997 | Hieda et al. | 348/296 |
| 5,742,058 A | * | 4/1998 | Pantigny et al. | 250/370.08 |
| 5,990,952 A | * | 11/1999 | Hamasaki | 348/311 |
| 6,018,365 A | * | 1/2000 | Merrill | 348/302 |
| 6,115,065 A | * | 9/2000 | Yadid-Pecht et al. | 348/308 |

FOREIGN PATENT DOCUMENTS

| | | | | |
|---|---|---|---|---|
| JP | 59033865 A | * | 2/1984 | H01L/27/14 |
| JP | 62007272 A | * | 1/1987 | H04N/5/335 |
| JP | 09093496 A | * | 4/1997 | H04N/5/335 |

\* cited by examiner

*Primary Examiner*—Wendy R. Garber
*Assistant Examiner*—John M Villecco
(74) *Attorney, Agent, or Firm*—McDermott, Will & Emery

(57) ABSTRACT

A method of driving a solid-state imaging device to increase the dynamic range of a CCD image sensor is described. The imaging device has a plurality of light receiving members arranged in a matrix in horizontal and vertical directions. In addition, a plurality of columns of vertical CCD registers associate with the light-receiving members for storing signal charges received from a plurality of light receiving members. A row of horizontal CCD registers is disposed and connected with one end of each columns of vertical CCD registers to transfer the signal charges received from those vertical CCD registers to an output circuit member. The method comprises receiving the signal charges from an object by those light-receiving members for a time period Cs firstly in a normal fashion in BLANKING "high" period. Then the extra exposure time Cx is performed by utilizing the BLANKING "low" period as follows: sending a reading pulse to read out the signal charges from all light receiving members simultaneously and independently to the adjacent vertical CCD registers at a beginning of a blanking period. After that, the light receiving members are vacant. The signal charges from the object by light receiving member are read and the signal charges are read into vertical CCD steps, repeated, several times to increase the dynamic range. The Cx should be smaller than $(n-1) \times Cs$ for avoiding the charge blooming, where n is the value of a capacity of VCCD divided by a capacity of photo sensor.

3 Claims, 9 Drawing Sheets

TECHNIQUE TO INCREASE DYNAMIC RANGE OF A CCD IMAGE SENSOR

BACKGROUND OF THE INVENTION

1. Field of the Invention

The present invention relates to a method of driving a solid-state imaging device and more particularly, to a method of driving a solid-state imaging device to increase the dynamic range of a CD image sensor.

2. Description of the Prior Art

Charge coupling device (CCD) image sensors offer a variety of applications as imaging picking up devices. Examples are the DSC (digital still camera) and video camera used for home-use, industrial and broadcasting purposes. Electric imaging merchandise has drawn much attraction to the improvement in image quality and sensing speed of CCD-related technology, such as the photo-sensing device structure and/or the driving circuit.

FIG. 1 shows a conventional solid-state imaging apparatus that includes a plurality of photo sensors 100 arranged in association with a plurality of vertical CCD registers 200 (herein after called VCCD) in columns. In addition, a row of horizontal CCD registers 300 is disposed and connected with one end of each columns of vertical CCD registers to transfer the signal charges received from those vertical CCD registers to an output circuit member 400.

The detailed relationship between a photo sensor array and a VCCD is illustrated with an example of a column of the same. Simultaneously referring to FIG. 1 and FIG. 2A, a first photo sensor 111 is adjacent to a first VCCD register 211 and a second photo 112 is connected with a third VCCD register 213 on the one side in the horizontal direction. The other side of each photo sensor 100 is adjacent to an isolation region 50. In the vertical direction, the VCCD register 211 is connected in series adjacent to VCCD registers 212, 213, 214 and so on. In addition, the VCCD registers 211, 212, 213, and 214 are connected to electrodes V1, V2, V3 and V4, respectively. The VCCD registers 215, 216, 217, and 218 are connected with electrodes V1, V2, V3 and V4, respectively. In other word, the signal charges transferred are carried out by modes of the four phases. Furthermore, the photo sensors 111, 112 and 113 are treated by complementary color filters so that they receive different signal charges. That is, three adjacent photo sensors constitute a set for representing the original color. For example, the first photo sensor 111 accesses the magenta color signal and the second photo sensor 112 accesses another kind of signal such as cyan. The third photo-sensor 113 accesses the green color signal. The remaining photo sensors of each of columns are arranged in a similar way.

Before picking up each pixel of an image, as shown in FIG. 2B, the contents of a photo sensor array 100 must first be reset. A sufficient high reverse voltage level of about 30 V (herein after called $V_H$) is applied at a terminal $V_{SUB}$ to form a depletion region 35 for each photo sensor. When the depletion regions 35 are expanded to overlap N-regions 40 of the photo sensor array 100, any charges in the photo sensors 100 are then discharged to the N-SUB 30. On the other hand, to start picking up an image, the terminal $V_{SUB}$ is supplied with a slighter lower level (herein after called $V_M$) of reverse bias of about 15 V. At this time, the depletion region 35 is formed and the signal charges in the photo sensors 100 are stored, as shown in FIG. 2C.

To read out the signal charges from a photo sensor, the electrode V1 should have a sufficient high voltage applied thereto. FIG. 2D shows various depths of the potential wells with respect to the timing and the voltage levels. At a time T1, V1 is at a voltage level "m", and a depth of the potential well under electrode V1at about an "m" level is formed. However, there is nothing to dispose to the VCCD 200 because there is a potential barrier to prevent the charge signal blooming. At a time T2, the corresponding potential decreases, and the height of the potential barriers increases. To read out the signal charges in a photo sensor, at a time of T3, the potential barrier disappears in response to a voltage level "h" supplied at electrode V1. A deep potential well is formed under the electrode V1 regions so that the signal charges are disposed thereto.

Referring to FIG. 3A, a waveform diagram showing the timings with respect to various pluses is given to illustrate a conventional method of driving the solid-state imaging device shown in FIGS. 1–2. The $V_{SUB}$, is pulsed with a high voltage of about $V_H$ to reset the photo sensors 100 firstly, and then supplied with a slightly reverse bias $V_M$ at the time indicated by "@". When the photo sensors 100 are exposed to the optical signal, the signal charges can be stored in it. Each of the photo sensors 100 provides an upper limited quantity "Q" of the charge storage capacity, and the charges in the photo sensors 200 are saturated after a period of time Cs. Therefore, to avoid a charge bloom, the vertical blanking signal VBLK is lowered (blanked) to a "0" state prior to saturation of the signal charges in photo sensors 100. At the same time, the exposure of photo sensors 100 is stopped. Generally, the signal charges in photo sensors 100 are not read out to the VCCD registers. 200 until time "®" in response to reading pulses XSG 1 and XSG2. It is noted that the XSG1 is processed by an inverter (not shown), and then connected to the electrode V1. The processed voltage level of the pulse XSG1 is same as the voltage level "h" indicated in FIG. 2D. The XSG2 is similar to the XSG1 pulse being processed by an inverter (not shown), but the processed voltage of the pulse XSG2 is then connected to electrode V3 so as to read out the signal charges in the second photo sensor 112 thereof.

An example of charges transferred by four-phase CCD is shown in FIG. 4. It is noted that the pulse XV1 is also processed by an inverter (not shown) and then the processed pulse of XV1 is applied to the electrode V1 to form a potential well thereunder. Certainly, as indicated in FIG. 2D, the depth of potential well varies with the magnitude of voltage level. The pulses XV2, XV3, and XV4 are similar to XV1, which are respectively in response to the electrode V2, V3, and V4. At a T1 time, XV1 and XV2 are supplied with a lower voltage. That is, both V1 and V2 are in a "high" state. Thus a potential well 201 under electrode XV1 and XV2 is formed, and charges Q are stored there. At a time of T2, XV2 remains the same, but XV1 voltage is increased by half and XV3 voltage is decreased by half, and thus two shallow potential wells 202, 203 and a deep potential well 204 are, respectively, formed under the electrodes V1, V3 and V2. In other words, a portion of the charges Q is transferred from the region under the electrode XV1 to that of electrode XV3. Similarly, at T3 time, the XV1 is raised to a high state (V1 is at "low state"), and thus the potential well thereunder disappears. The chares Q is then completely transferred from a region under the electrode V1 to a region under the electrodes V2 and V3, which have a high voltage. Finally, at a time of T4 all charges Q are adjacently disposed on the right side thereof as shown in FIG. 4, and the potential well is formed under electrodes V3 and V4.

Conventional transferal of the signal charges in VCCD using SONY ICX058AK chip is given as an example. It is done by an interlacing manner. As is shown in FIG. 3A and FIG. 1, a sufficient high reverse voltage level of about 30 V (herein after called $V_H$) is applied at a terminal $V_{SUB}$ to reset all the photo sensors 100, which are then exposed to the optical light start. The photo sensors 100 receive the signal charges for a period of time Cs. When BLK falls down to a "low" state, the first photo sensor 111 receives Q11, a quantity of charges, the second photo sensor 112 receives charges Q12, the third photo sensor 113 receives Q13, and so on. It is noted that the photo sensor 111, 112 and 113 are treated by complementary color filters so that they receive different signal charges. That is, three adjacent photo sensors constitute a set for representing the original color.

FIG. 3B shows a local magnifying timing diagram versus the odd field signal charges transferring pulse. A column of photo sensors and associated VCCD are again used as an example of data received and transferred. At a time "B1", a reading pulse XSG1 is supplied to read out signal charges Q11 received by a first photo sensor 111 into a potential well of VCCD 211 (herein and after called VCCD [211]. Similarly, Q12 is stored to VCCD [213], and Q3 stores to VCCD [215]. It is noted that the electrode of VCCD 211 is supplied with "XV1" and VCCD 215 is the same. The same is the VCCD 222 and VCCD 112 and both electrodes are labeled as V2. At a time of "B3", XV1, XV2, and XV3 are in a "0" state but XV4 is in a "1" state.

For ODD field transferring, the Q11 is added to the Q12 and then stored in a potential well formed of VCCD 211, VCCD 212, and VCCD 213. At a time of "B4", XV1 and XV4 are in a "1" state, XV2 and XV3 in a "0" state; thus Q11+Q12 then is moved forward to VCCD[112 and 113]. At a time of "B5", XV1 is in a "1" state but XV2, XV3, XV4 are in a "0" state; thus Q11+Q12 is then transferred to VCCD [212, 213 and 214]. At a time "B6", XV1 and XV2 are in "1" state but XV3, XV4 are in "0" state; thus Q1+Q2 then is moved to VCCD [213 and 214] and then moved to VCCD [213,214, and 215] at time "B7". In a similar manner, when Q1 and Q2 then are moved finally to VCCD [214 and 215], the Q3 and Q4 are moved to VCCD [218 and 219] at time "B8". At the same time, the signal charges of the VCCD register to most adjacent horizontal CCD registers (called HCCD) and then are firstly disposed to HCCD 300. The signal charges in HCCD are transferred in two phases, H1 and H2. The signal charge is transferred in the same fashion as mentioned with regard to VCCD. Finally, a 0.5 horizontal line, the field "1" corresponding to the signal charges of the last two rows of the photo sensors, and then output a field "3" corresponding to the signal charges of the last third and fourth rows of photo sensors.

For an "EVEN" field transferal, as shown in FIG. 3C, the signal charges Q11, Q12, Q13 . . . , are, respectively, in VCCD [211], [213], and [215], ready to be transferred. At a time of "C1", XV1, XV3, and XV4 are in a "0" state but XV2 is in a "1" state, and thus the Q11 is stored in VCCD [211] and Q2+Q3 is stored in VCCD [213, 214, and 215]. At a time of "C2", XV1 and XV4 are in "0" state, XV2 and XV3 in "1" state, Q1 still remains in VCCD [211], and Q2+Q3 is moved forward to VCCD [214 and 215]. At a time of "C3", XV3 is in "1" state but XV1, XV2 and XV4 are in "0" state, and thus Q1is transferred to VCCD [211 and 212], and Q2+Q3 is transferred to VCCD [214, 215, and 216]. At a time of "C4", XV1 and XV2 are in "0" state but XV3, XV4 are in "1" state; thus Q1 is then transferred to the potential well of VCCD [211 and 212], and Q2+Q3 is moved to VCCD [215 and 216]. In a similar manner, the signal charges in the photo sensors most adjacent to a plurality of HCCD then are firstly disposed to HCCD. Another 0.5 horizontal line is output, the field "2" corresponding to the signal charges of the last row of photo sensors is output, and then a field "4" corresponding to the signal charges of the last second and third rows of photo sensors is output.

The problems occurring in the prior art are as follows:

Since each of the photo sensors with a capacitor can store only a limit quantity of charges, some of the signals need to be sacrificed. This is because a desired image, in general, comprises both strong contrast regions and weak contrast regions. If charge blooming in the sensor were prevented for a bright region, the information received in the sensor for the heavily dark region would not be enough. In contrast, is the heavily dark region were sufficiently intense, charge blooming in the sensor would occur for a bright region.

SUMMARY OF THE INVENTION

A method of driving a solid-state imaging device to increase the dynamic range of a CCD image sensor is disclosed. The imaging device comprises a plurality of light-receiving members arranged in a matrix in horizontal and vertical directions. In addition, a plurality of columns of vertical CCD registers associate with the light-receiving members for storing signal charges received from a plurality of light receiving members. A row of horizontal CCD registers is disposed and connected with one end of each columns of vertical CCD registers to transfer the signal charges received from those vertical CCD registers to an output circuit member. The method comprises receiving the signal charges from an object by those light receiving members to a time period Cs firstly in a normal fashion in BLANKING "high" period. Then the extra exposure time Cx is performed by utilizing the BLANKING "low" period as follows: sending a reading pulse to read out the signal charges from all of those light receiving members simultaneously and independently to the adjacent vertical CCD registers at a beginning of a blanking period. After that, the light receiving members are vacant. Receiving the signal charges from the object by light receiving member and reading the signal charges into vertical CCD steps are done repeatedly, several times, to increase the dynamic range. The Cx should be smaller than (n–1)×Cs to avoid charge blooming, where n is the value of a capacity of VCCD divided by a capacity of photo sensor.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

As depicted in the background of the invention, when images comprise both a strong contrast region and a weak contrast region, for obtaining the better resolution, some of the signals need to be sacrificed, since each of the photo sensors is limited in capacity. It is useless to amplify all signals by an external circuit since the noise is also amplified simultaneously. Hence, the signal/noise ratio does not increase at all.

Figure 1:
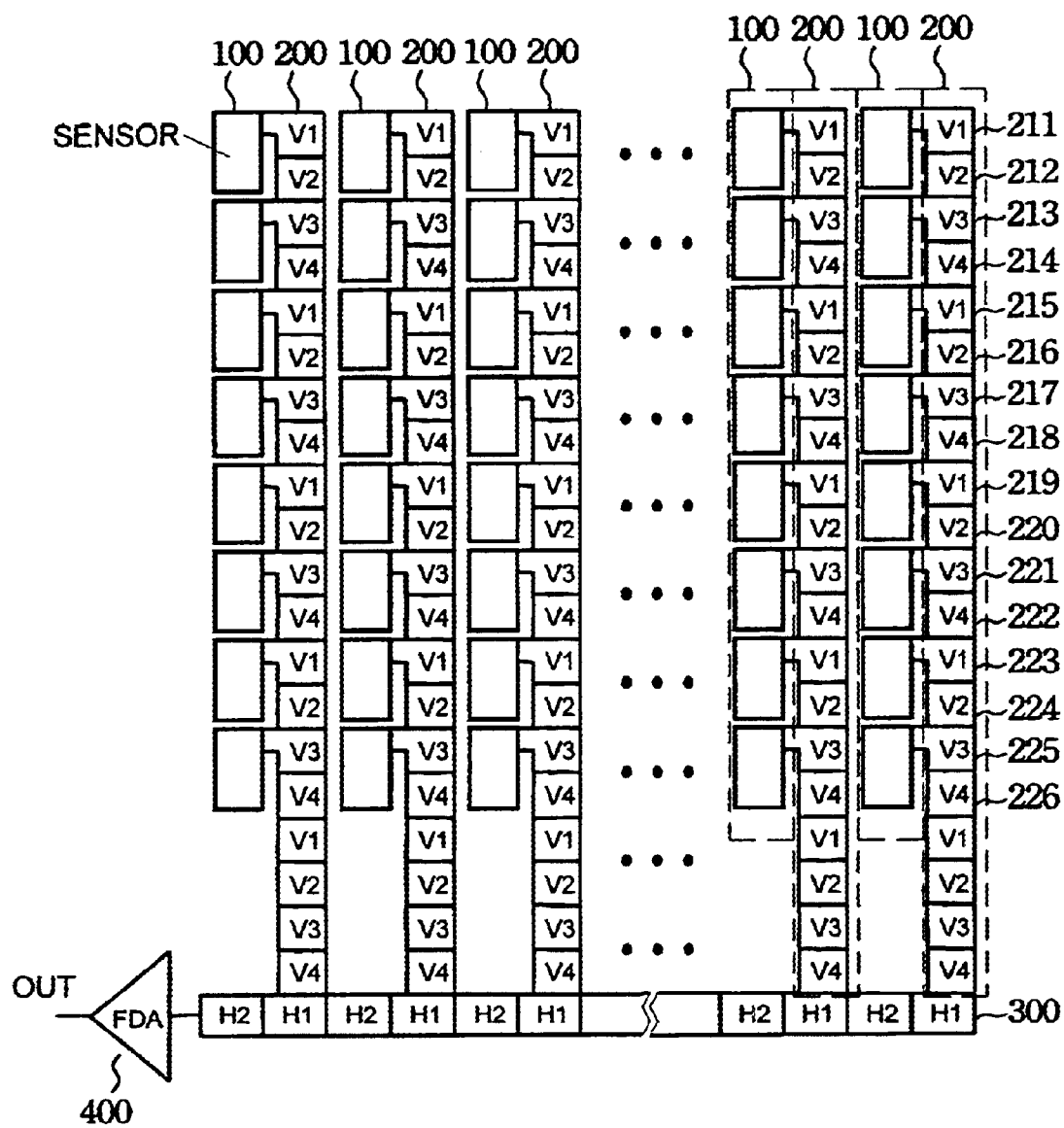
FIG. 1 is a synoptic layout of solid state image devices in accordance with the SONY ICX058AK chip.
Figure 2A:
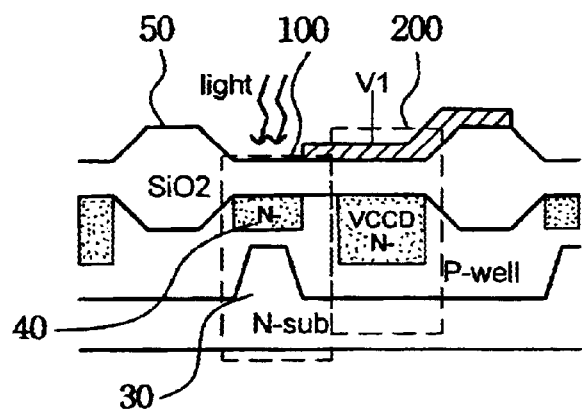
FIG. 2A is a cross-sectional view of a photo sensor and a VCCD register in accordance with the SONY ICX058AK chip.
Figure 2B:
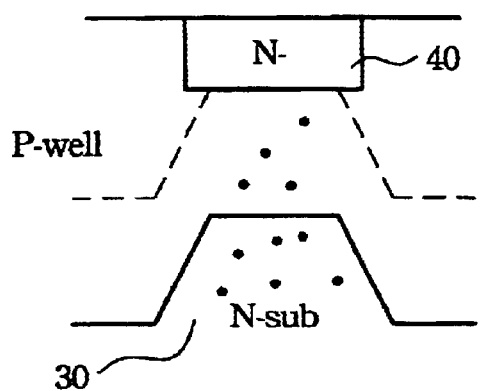
FIGS. 2B–2C are a magnified cross-sectional view of a photo sensor in FIG. 2A for a depletion region formed in accordance with the prior art.
Figure 2C:
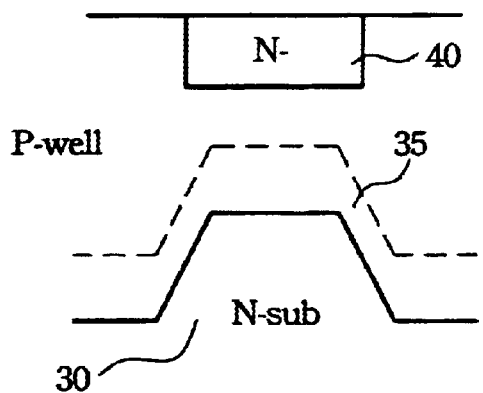
Figure 2D:
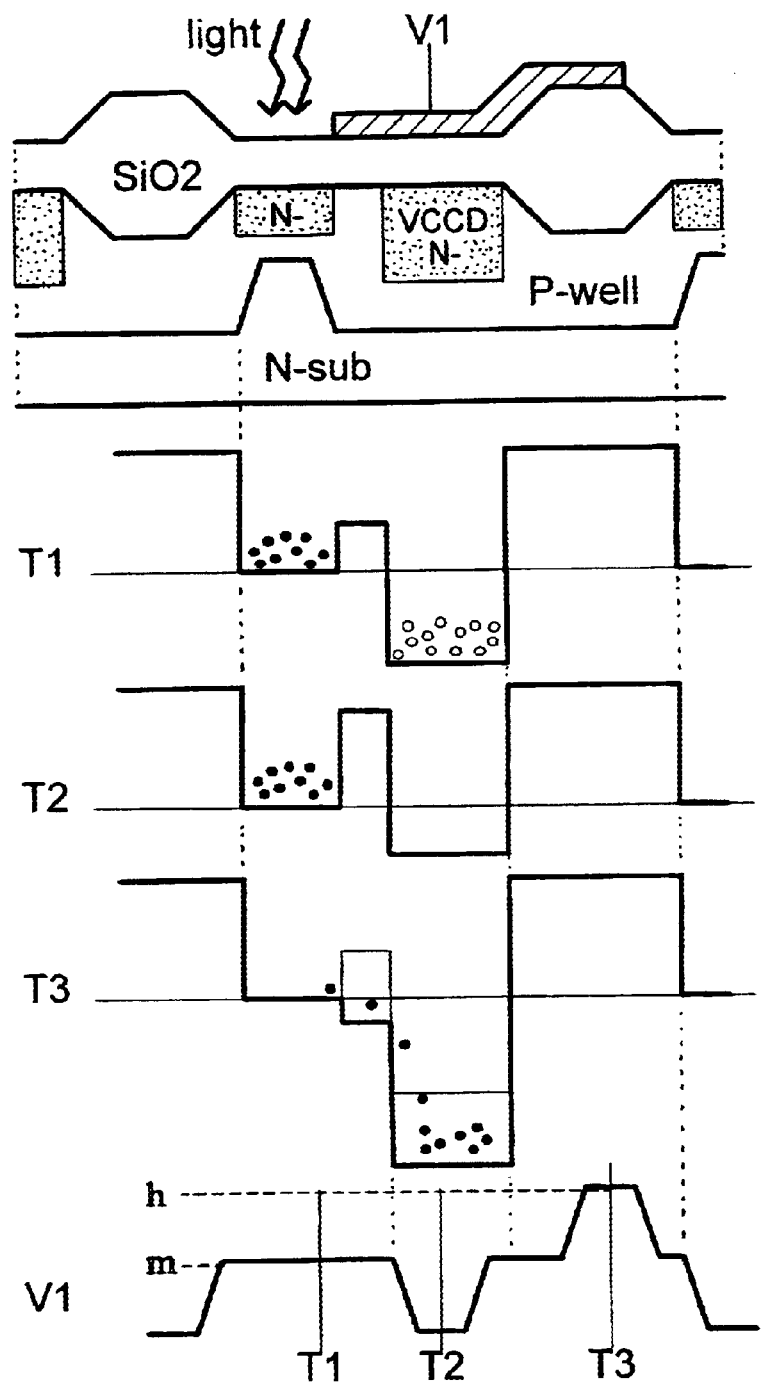
FIG. 2D is a series variation of various potential well depths versus voltage level and timing.
Figure 3A:
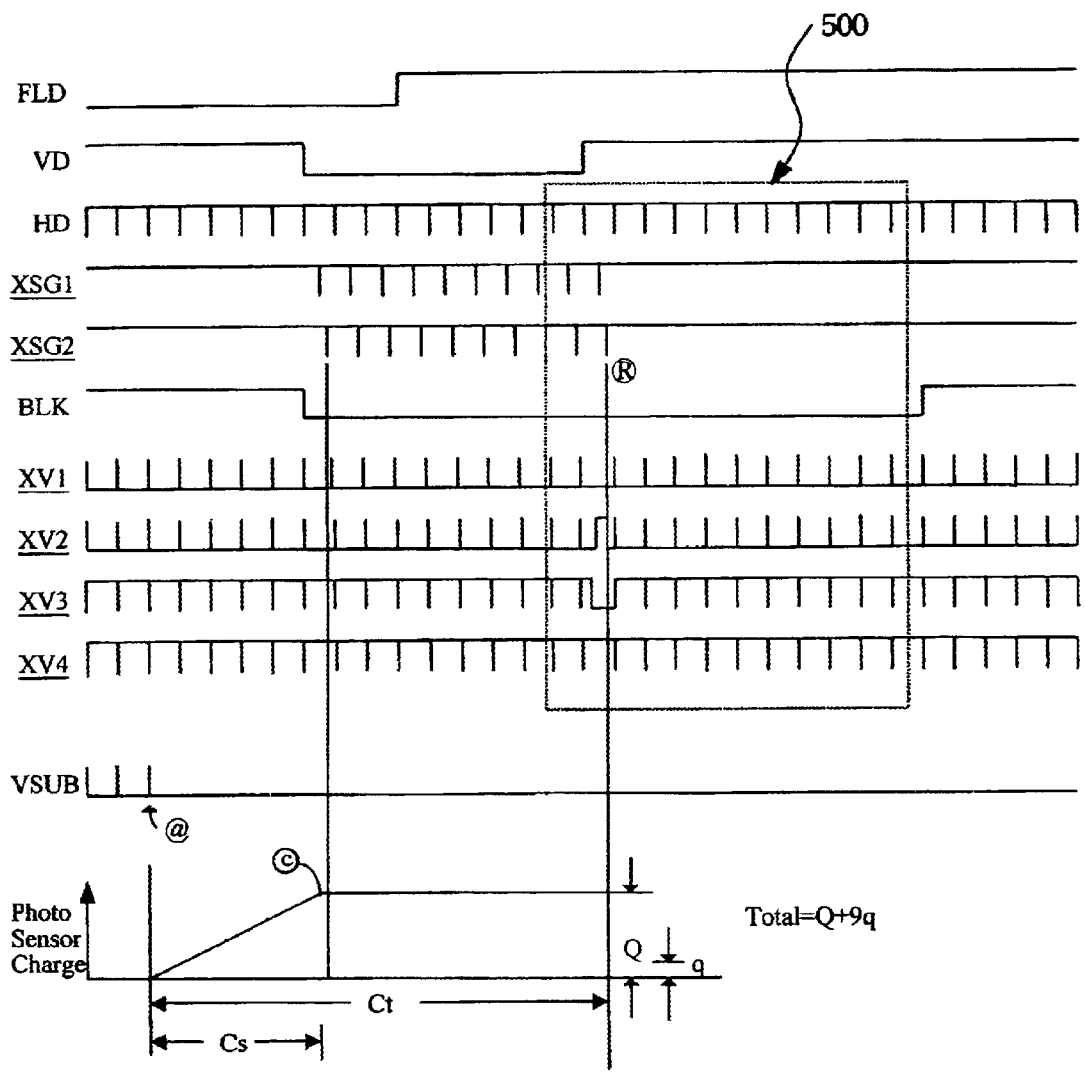
FIG. 3A is a timing diagram of driving solid state image devices in accordance with the prior art.
Figure 3B:
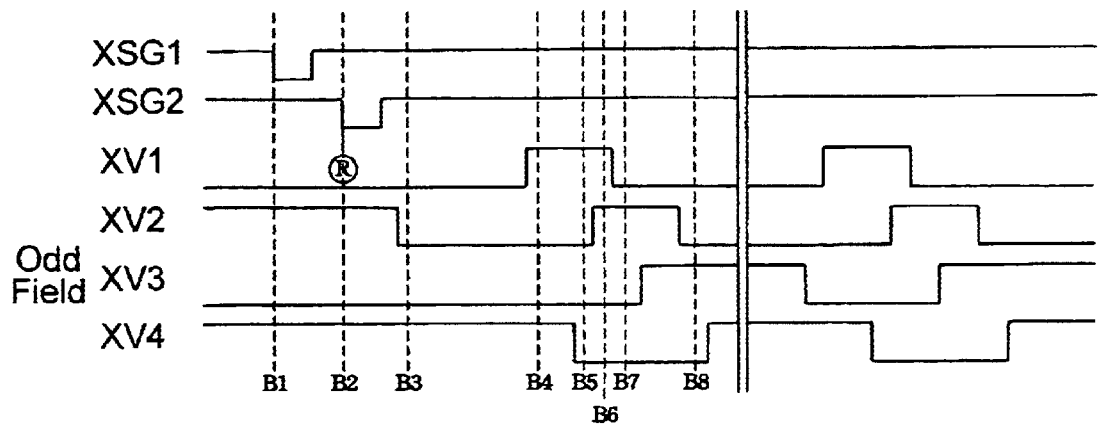
FIG. 3B is a local magnified timing diagram of FIG. 3A for ODD filed charge transfer.
Figure 3C:
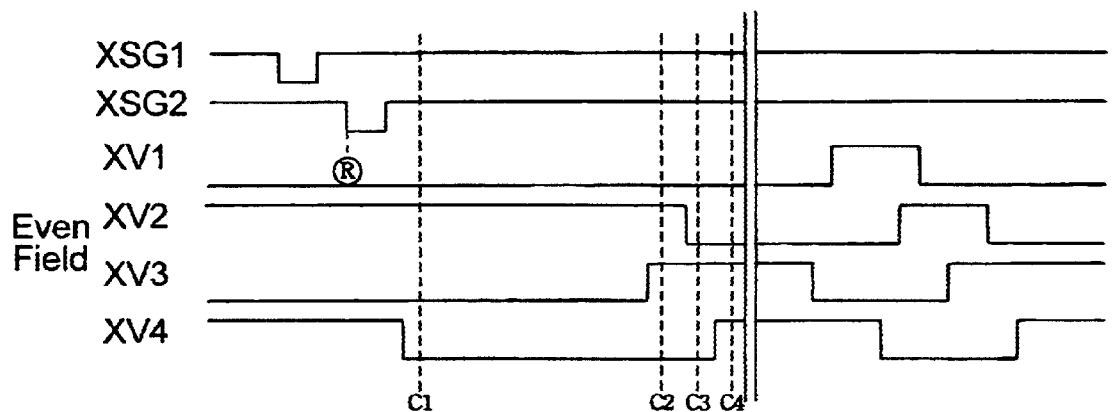
FIG. 3C is a local magnified timing diagram of FIG. 3A for EVEN filed charge transfer.
Figure 4:
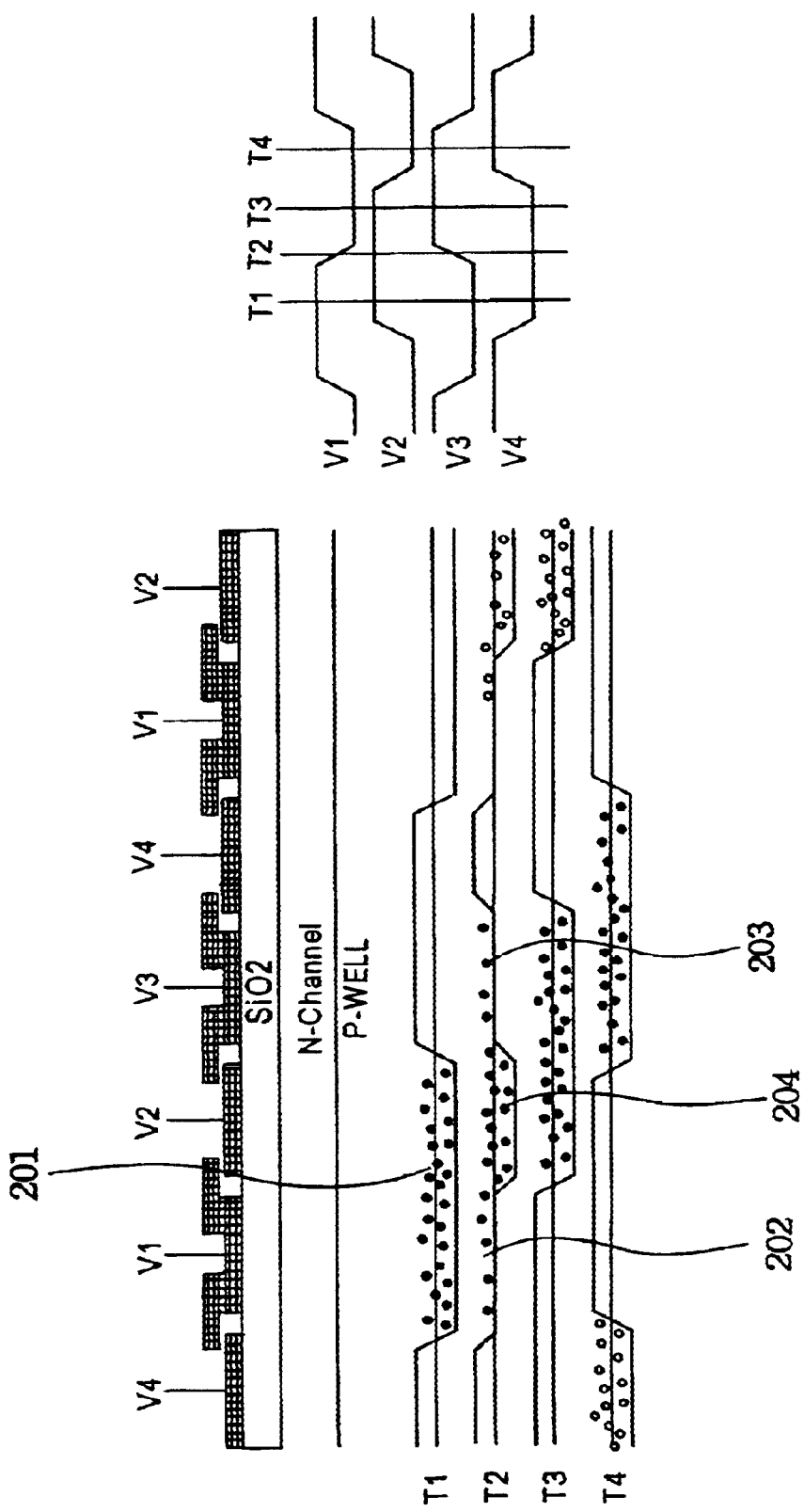
FIG. 4 is a series variation of various the potential well depths versus voltage level and timing for four phases VCCD charge transfer in accordance with the prior art.

In a preferred embodiment, the present invention use a CCD chip that it is the same as depicted in the prior art, SONY ICX058AK. Hence, the layout of the photo sensor array 100 associated with the VCCD register devices 200 is the same, and is as shown in FIG. 1. The structure of the photo sensor and a VCCD are also shown in FIG. 2A. However, the invention provides an improvement of sense timing method to increase the dynamic range.

Figure 5A:
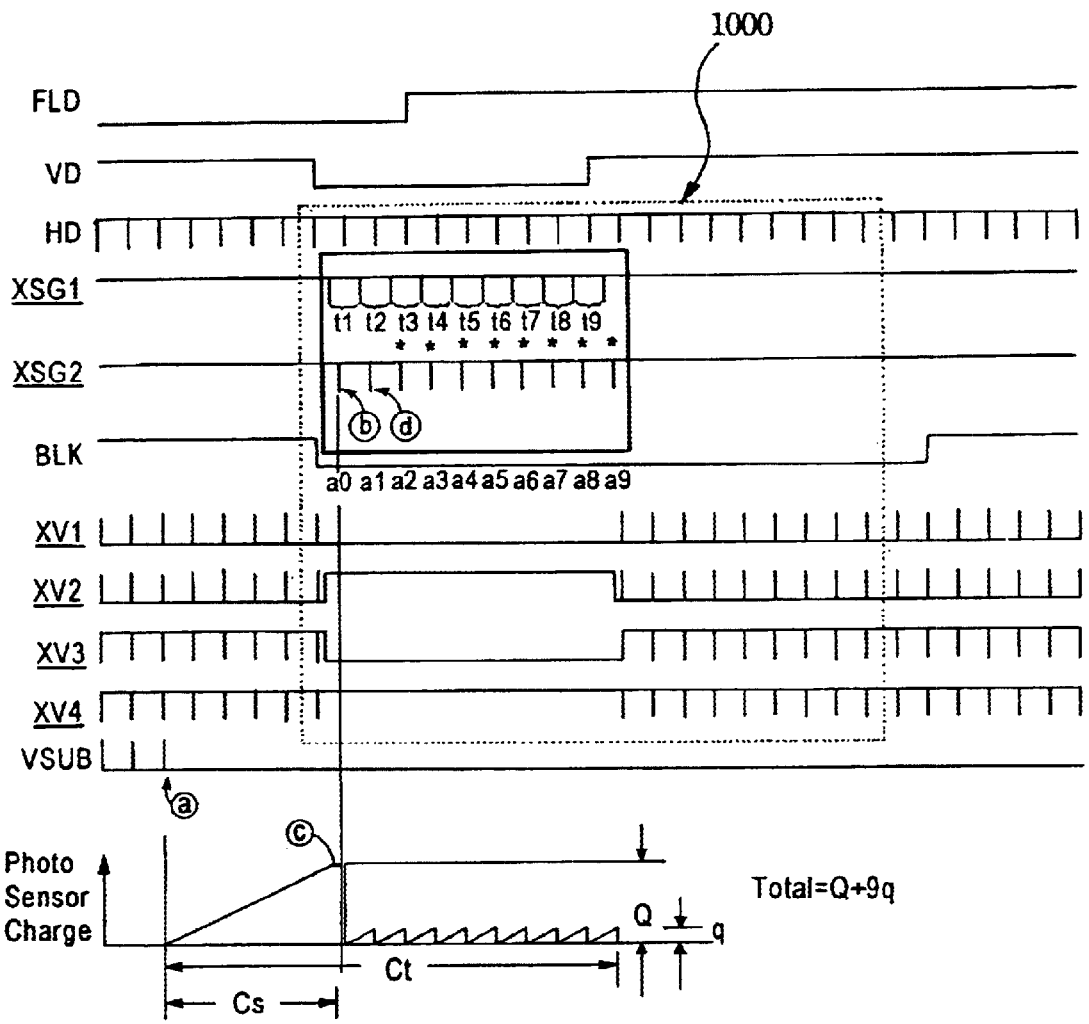
FIG. 5A is a timing diagram of driving solid state image devices in accordance with the present invention.

Please refer to FIG. 5A. A reverse voltage level of about 30 V is applied at a terminal $V_{SUB}$ to reset all the photo sensors 100, and then an exposure to the optical light starts. The exposure time of the photo sensors 100 is to about Cs, before BLK falls down to a "low" state. In the first column, the photo sensors 111, 112, 113 and 114 receive a quantity of charges Q11, Q12, Q13 and Q14, respectively. As depicted in the prior art, the photo sensor 111, 112 and 113 are treated by complementary color filters so that they receive different signal charges. That is, three adjacent photo sensors constitute a set for representing the original color. After the read out pulses XSG1 and XSG2 are supplied sequentially to read out the signal charges Q11 and Q12 from the photo sensor 111and 112, respectively, into VCCD [111, 113], the photo sensors 111,and 113 become vacant. Hence, they can receive the signal charges again even though the BLK signal has fallen. The photo sensors, 113, 114, and so on are the same. The states of XV1, and XV3 both maintain a "low" level to form potential wells under thereby. Then the signal charges quality, $q11_1$ $q11_2$, $q11_3$, ... and $q11_9$, received corresponding to time intervals, t1, t2, t3, ... and t9, are read out by a successive pulses XSG1 at time intervals, a1, a2, a3, ... and a9, into VCCD 111. The signal charges, $q12_1$, $q12_2$, $q12_3$, ... and $q12_9$, are signal charges quality received by photo sensor 112 during the same time intervals, t1, t2, t3, ... and t9 read out into the VCCD 113 by successive pulses XSG2. In general, each time interval is of about 10–100 μs. It is noted that how much extra exposing time Cx can be utilizing is in accordance with the size ratio of the VCCD and the photo sensor. The total extra exposing time Cx (e.g., from "a0" to "a9") should satisfy (Cs+Cx)/Cs<n, where n is the value of a capacity of VCCD divided by a capacity of a photo sensor to avoid the signal charges blooming. After the time of "a9" the charge reception stops, the total charges in VCCD 11 are $Q11+q11_1+q11_2+\ldots+q11_9$ called Q11t, and in VCCD 13 there are total charges of about Q2t, where $Q12t=Q12+q12_1+q12_2+\ldots+q12_9$, and in VCCD 15 there are total charges of about Q13t, where $Q13t=Q13+q13_1+q13_2+\ldots+q13_9$.

Figure 5B:
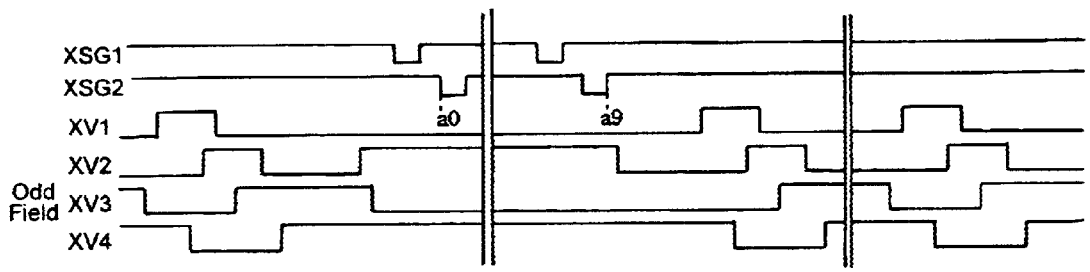
FIG. 5B is a local magnified timing diagram of FIG. 5A for ODD field charge transfer.

FIG. 5B shows a local magnifying timing diagram versus the odd field signal charges transferring pulse. At a time of "a9", the total signal charges Q11t, Q12t, Q13t, are respectively in the potential wells of VCCD 11, VCCD 13, and VCCD 21 waiting for transferring by an odd field mode. The signal charges are moved forward to the HCCD in a similar way as depicted in the prior art. At first, the Q11t is added to the Q12t and then in a sequence as follows: VCCD [211, 212, and 213]→VCCD [212 and 213]→VCCD [212, 213 and 214]→VCCD [213 and 214]→VCCD [214]. At the same time, Q13t+Q14t transferred to VCCD [218]. In the embodiment, the first outputted to the HCCD 300 are those signal charges in the photo sensors 117 and 118, which are the two cells in the last two rows. The signal charges in HCCD 300 are then transferred by two phases in the way depicted in VCCD. Finally, a 0.5 horizontal line, the field "1", is produced. A field "3" corresponding to signal charges in another two rows of photo sensors is then output.

Figure 5C:
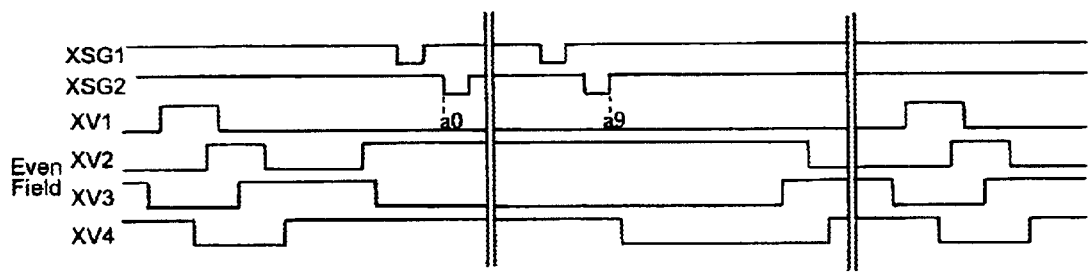
FIG. 5C is a local magnifying timing diagram of FIG. 5A for EVEN field charge transfer.

During an EVEN field, as shown in FIG. 5C, before the signal charges are transferred, a quantity of signal charges is received in the VCCD [211]. Q12t is received in the VCCD [213], and Q13t is received in VCCD [215] by a manner as depicted in FIG. 7. The transferring process, however, it is not the same as for an odd field. The signal charges transferal is in a sequence as follows: Q11t in the VCCD [211] and Q12t are added to Q13t in VCCD [213, 214 and 215] →VCCD [214 and 215]→VCCD [214, 215, 216]→VCCD [215 and 216]. As is seen in FIG. 5C, when Q2+Q3 moves to VCCD [215 and 216], Q1 reaches VCCD [211, 212], and Q3+Q4 attains VCCD [219, 210], the remainder signal charges are moved in a similar manner. Finally, the signal charges moves forward to HCCD and then another 0.5 horizontal line corresponding to field 2 is output. Field 4 is output in sequence.

The invention is achieved by means of a principal that the signal charges in the photo sensor array 100 are read out to each corresponding VCCD 200 whenever the BLK signal falls to "0" but none of the signal charges is transferred immediately. The signal charges in each photo sensor can, therefore, be accumulated in a fixing vertical CCD channel instead. The photo sensor array 100 senses the signal and is read into VCCD repeatedly. The maximum extra sensing time Cx can come up to a level until the equation (Cs+Cx)/Cs<n is false. In other word, Cx should be smaller than (n–1)×Cs for avoiding charge blooming; hence, a multiplier (not shown) for calculating how much of the extra exposure time can be used is required.

It is noted that for increasing the dynamic range, two associated measures can be taken:

(1) increasing the size of the vertical CCD registers 200 (i.e. the channel width and the depth) to effectively increase the charge transfer capacity.

(2) increasing the potential well depth of the vertical CCD registers 200. For attaining the goal of increasing the potential well depth, either the CCD physical depth or the CCD driving voltage can be increased; preferably, the driving voltage is about 15–30V.

Figure 6A:
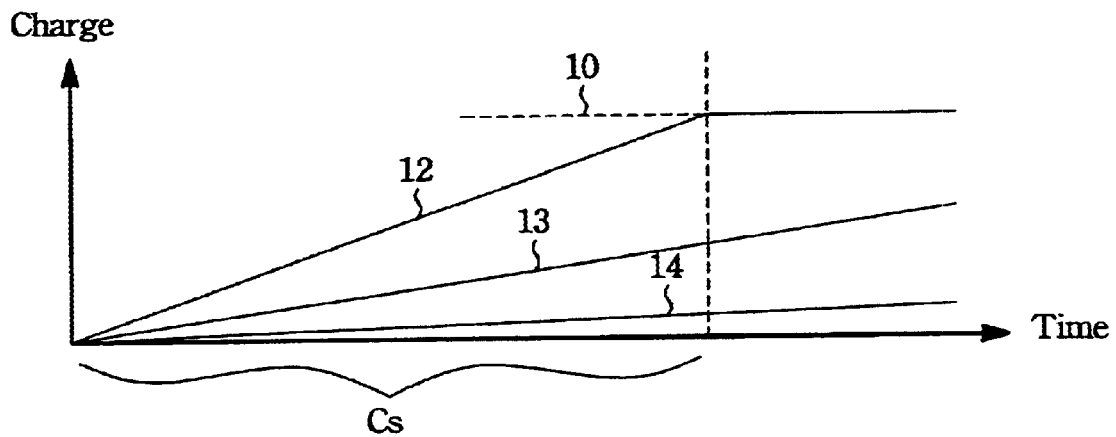
FIG. 6A is a plot of charge quantity versus exposure time in accordance with the prior art.
Figure 6B:
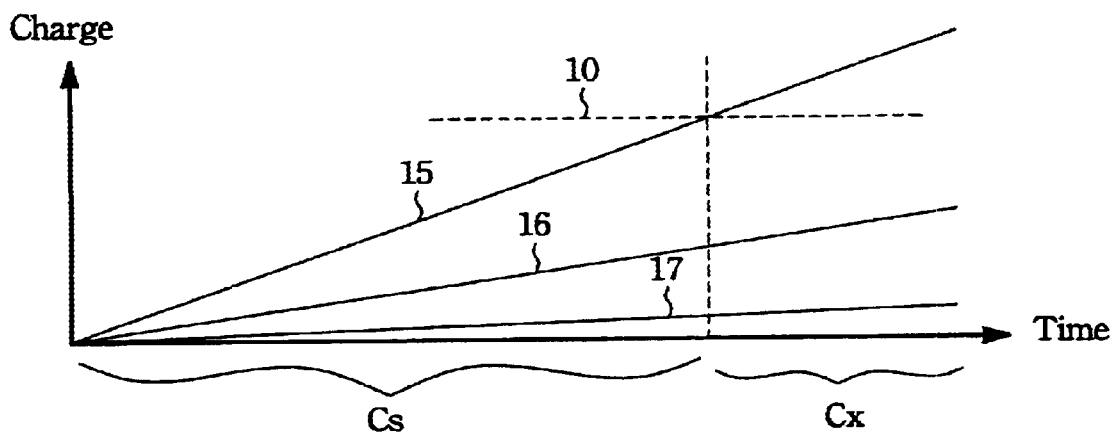
FIG. 6B is a plot of charge quantity versus exposure time in accordance with the present invention.

The invention has several advantages over the prior art. Please see the graphs in FIGS. 6A and 6B. In FIG. 6A the dashed curve 10 shows a charge saturated level for a photo sensor. Solid line 12 shows charge receiving versus exposure time of a brightest region in the image. The maximum exposure time can only come up to "Cs", or the signal will overflow. The solid lines 13 and 14 represent regions in order of decreasing brightness. Hence, the exposure curve of the darkest region shows the intensity is not enough for exposure time Cs. However, the exposure curves of the invention as shown in FIG. 6B, the charges saturated issue occurring in the brightest region (represented by solid line 15) does not exist because the charges are disposed to VCCD after initial exposure time Cs. Thus the brightness of the darkest region (represented by solid line 17) can be enhanced due to the extra exposure time Cx.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

For examples, the invention uses the SONY ICX058AK chip as an embodiment; however, this is not a limitation since the invention is capable of application to other solid state imaging devices. In addition, the invention utilizes a concept of modifying the read out timing from which an extra exposure time period can be introduced to enhance the intensity of dim region and the resolution on a desired image. The read-out signal is sent to read the signal charge in the photo sensors into VCCD immediately while the BLK falls from "high" to "low". However, the signal charges are latched in the corresponding VCCD registers. It is thus independent of the signal charges transferring method in the embodiment of the invention, as well.

What is claimed is:

1. A method of driving a solid-state imaging device comprising a plurality of light receiving members arranged in a matrix in horizontal and vertical directions, a plurality of columns of vertical CCD registers associated with said lighting receiving members for reading signal charges received from said plurality of light receiving members to transfer signal charges in the vertical direction, and a row of horizontal CCD registers disposed at one end of each column of said plurality of vertical CCD registers to transfer the signal charges received from said plurality of columns of vertical CCD registers to an output circuit member, said method comprising:

a first step of receiving the signal charges from an object by said plurality of light receiving members, wherein the period of time taken in said first step is Cs;

a second step of sending a reading pulse to read out signal charges from all of said plurality of light receiving members simultaneously and independently to said plurality of vertical CCD registers at a beginning of a blanking period;

a third step of receiving the signal charges by said plurality of light receiving members for a period of time;

a fourth step of sending a reading pulse to read out the signal charges from all of said plurality of light receiving members simultaneously and independently added to said plurality of vertical CCD registers in a successive interval of a BLK period;

a fifth step of repeating the third step and the fourth step several times, wherein the number of said times is determined by a capable exposure time T1, said capable exposure time T1 is smaller than an equation of $(n-1) \times$ Cs, where n is a ratio of a charge capacity of one of said CCD registers to a charge capacity of one of said light receiving members;

a sixth step of transferring forward the signal charges in said plurality of vertical CCD registers to said horizontal CCD registers; and a seventh step of transferring the signal charges in said horizontal CCD registers to said output circuit member.

2. The method of claim 1, wherein said period of time in said third step is about 10–100$\mu$s.

3. The method of claim 1, further comprising the step of applying a driving voltage, about 15 to 30 Volts, to said plurality of vertical CCD registers so as to increase a signal charge capacity of said plurality of vertical CCD registers to prevent signal charge blooming received from said plurality of light receiving members.

* * * * *